United States Patent [19]

Ogiwara et al.

[11] Patent Number: 4,965,623
[45] Date of Patent: Oct. 23, 1990

[54] IMAGE RECORDING APPARATUS AND METHOD

[75] Inventors: Nagao Ogiwara; Akihiko Nagumo, both of Kanagawa, Japan

[73] Assignee: Fuji Photo Film Co., Ltd., Kanagawa, Japan

[21] Appl. No.: 292,842

[22] Filed: Jan. 3, 1989

Related U.S. Application Data

[62] Division of Ser. No. 151,125, Feb. 1, 1988, Pat. No. 4,827,312.

[30] Foreign Application Priority Data

| Jan. 30, 1987 | [JP] | Japan | 62-19952 |
| Feb. 6, 1987 | [JP] | Japan | 62-26800 |
| Feb. 13, 1987 | [JP] | Japan | 62-31098 |
| Feb. 13, 1987 | [JP] | Japan | 62-31100 |
| Apr. 24, 1987 | [JP] | Japan | 62-100143 |
| Nov. 10, 1987 | [JP] | Japan | 62-281993 |
| Nov. 12, 1987 | [JP] | Japan | 62-286780 |

[51] Int. Cl.$^5$ .............. G03B 27/32; G03B 27/52; G03D 9/00; G03C 1/72
[52] U.S. Cl. ................................ 355/27; 354/304; 430/138
[58] Field of Search .................... 346/108 R; 354/299–304; 355/27; 430/138

[56] References Cited

U.S. PATENT DOCUMENTS 4,727,392 2/1988 Stone et al. .......................... 354/304

Primary Examiner—Richard A. Wintercorn
Attorney, Agent, or Firm—Sughrue, Mion, Zinn, Macpeak & Seas

[57] ABSTRACT

An image recording apparatus in which an image recording material bearing an image to be recorded and an image receiving sheet are stacked together and pressurized with a pair of pressurizing rollers so that the image is transferred to the image receiving sheet. A back-up roller, the length of which is about one-third that of the pressurizing rollers, suitably presses at least one of the pressurizing rollers at the middle portion thereof.

4 Claims, 13 Drawing Sheets

IMAGE RECORDING APPARATUS AND METHOD

This is a division of application Ser. No. 07/151,125, filed 2/1/88, now Pat. No. 4827312.

BACKGROUND OF THE INVENTION

The present invention relates to an image recording apparatus for recording images using photosensitive pressure-sensitive materials, and more particularly to an image recording apparatus in which a latent image is formed on a photosensitive pressure-sensitive image recording material by exposure, and the image recording material is pressed against an image receiving material for development of the image.

An example of a conventional image recording apparatus using microcapsules containing a photosensitive image recording material employs synthetic macromolecular resin wall capsules containing a vinyl compound, photopolymerization initiator and coloring agent precursor. Such an apparatus is disclosed in commonly assigned Japanese Unexamined Published Patent Application No. 179836/1982. In this apparatus, the microcapsules are hardened in the pattern of an image by optical exposure and then pressurized so that microcapsules which were not hardened are broken to discharge the coloring agent precursor thereby to form a color image. This apparatus is advantageous in that an image of high picture quality can be readily obtained by dry processing.

However, the above-described photosensitive material is disadvantageous in that it has a much lower photosensitivity than a photosensitive material using silver halogenides such as common photographic emulsions.

This difficulty has been eliminated by the provision of a novel photosensitive material, as described, for example, in commonly assigned Japanese Unexamined Published Patent Application No. 275742/1986. This novel photosensitive material is high in photosensitivity and provides an image high in picture quality using simple dry processing. The photosensitive material is formed by coating a support at least with photosensitive silver halogenide, a reducing agent, a polymerizing compound and a color image forming material. Of these materials, at least the polymerizing compound and the color image forming material are, in combination, sealed in microcapsules.

An image recording apparatus using the above-described photosensitive material is disclosed in Japanese Unexamined Patent Publication No. 147,461/1987. In that apparatus, first the image recording material is optically exposed to form a latent image thereon, and then subjected to thermal developing so that, in the region of the image, the polymerizing compound is polymerized to produce a macromolecular compound to thereby harden the microcapsules. Thereafter, the image recording material thus processed is stacked on an image receiving material having an image receiving layer onto which the color image forming material can be transferred, and the image recording material and the image receiving material are pressurized so that, in the region where no latent image is formed, some of the microcapsules are broken to transfer the color image forming material to the image receiving material to form a visible image.

In the image recording apparatus, the photosensitive material and the image receiving material are stacked together and are then pressurized by a pair of pressurizing rollers so that the color image forming material is accurately transferred to the image receiving material. For this purpose, the pressurizing rollers must be sufficiently long that they cover the width of the photosensitive material and the image receiving material. Therefore, when one of the pressurizing rollers is pressed at both ends against the other, for instance by springs, the one pressurizing roller is bent so that only the two end portions of the latter are pressed against the other pressurizing roller. That is, pressure is not sufficiently applied to the middle portion of the photosensitive material, and accordingly the color image forming material is not accurately transferred to the image receiving material.

To eliminate the above-described difficulty, an image recording apparatus has been proposed in which a back-up roller whose middle portion is larger in diameter than the remaining two end portions is used to press only the middle portion of one of the pressurizing rollers against the other so that the above-described bending of the pressurizing roller is corrected. However, the image recording apparatus is still disadvantageous in that, since the large-diameter middle portion of the back-up roller tends to bend in the longitudinal direction, only the two end portions of the large-diameter middle portion press against the pressurizing roller, as a result of which the pressure applied by the pressurizing roller is still not uniform, and hence the color image forming material is still not accurately transferred to the image receiving material.

Moreover, if the pressure distribution of the pressurizing rollers is not uniform as described above, the photosensitive material and the image receiving material have a tendency to be partially displaced towards the part or parts of the pressurizing rollers where the pressure is lower, as a result of which the photosensitive material and the image receiving material are creased. The amount of creasing increases with the amount of nonuniformity of the pressure distribution. As a result, the color image forming material is not accurately transferred to the image receiving material, and the resultant image is considerably irregular in density.

Also, if the pressurizing rollers' pressure distribution is not uniform as described above, the photosensitive material and the image receiving material, being held by the pressurizing rollers, have a tendency to be creased. Due to the creases, the nonuniformity of the pressure distribution is further increased, and the unevenness in density of the image becomes more significant.

Furthermore, not only in the above-described image recording apparatus, but also in some electrophotographing apparatuses, the nip rollers are used to apply a high pressure to the image recording material to obtain the image. In this operation, it is unavoidable that the image recording material is nonuniformly pressurized.

To eliminate the above-described difficulty, a skew roll pressurizing device has been proposed in which a pair of pressurizing nip rollers are arranged in such a manner that their axes form a slight angle so that the pressure provided in the nip region of the two rollers is uniform over their entire length. For the same purpose, a back-up roller pressurizing device has been proposed in which two back-up rollers are arranged outside a pair of pressurizing nip rollers so that the pressure provided in the nip region of the pressurizing nip rollers is uniform over the entire length.

However, the former device is disadvantageous in that the device cannot handle a plurality of image recording materials differing in thickness or in width. On the other hand, when the image recording material and the image receiving material stacked together are conveyed while being pressurized by the pressurizing nip rollers, the image recording material and the image receiving material are conveyed in directions perpendicular to the axes of the respective nip rollers they contact, and therefore the rear end portion of each of the image recording material and image receiving material tends to be greatly shifted from the front end portion in the widthwise direction.

The latter device is also disadvantageous in that, since it requires two back-up rollers in addition to the pressurizing nip rollers, the device is unavoidably bulky and high in weight.

Furthermore, these two devices suffer from a difficulty that they are intricate in construction because it is necessary to adjust the pressurizing forces of the pressurizing nip rollers.

SUMMARY OF THE INVENTION

Accordingly, an object of the present invention is to eliminate the above-described difficulties accompanying a conventional image recording apparatus in which a photosensitive pressure-sensitive image recording material is optically exposed according to an image to be recorded and the image recording material is pressed against an image receiving material so that the image is formed on the image receiving material.

More specifically, an object of the invention is to provide an image recording apparatus in which a photosensitive pressure-sensitive image recording material is optically exposed according to an image to be recorded, and the image recording material is pressed against an image receiving material so that the image is formed on the image receiving material, and in which, when the image recording material is pressed against the image receiving material, the image is formed on the image receiving material with high picture quality.

Another object of the invention is to produce such an apparatus in which the weight of the apparatus can be readily reduced.

The foregoing and other objects of the invention have been achieved by the provision of an image recording apparatus in which a photosensitive pressure-sensitive image recording material bearing an image and an image receiving material stacked together are pressurized with a pair of pressuring rollers while being held therebetween so that the image is transferred to the image receiving material, and which, according to the invention, comprises a back-up roller for applying a predetermined pressurizing force to at least one of the pair of pressurizing rollers at the middle thereof, the back-up roller having a length which is substantially one-third the length of the pair of pressurizing rollers.

The technical concept of the invention is effectively applicable to an image recording apparatus in which the image recording material is optically exposed to form an image thereon and subjected to thermal developing, and the image recording material is pressed against the image receiving material so that the image is transferred to the latter.

A suitable image recording material has been disclosed in Japanese Unexamined Patent Publication No. 297,742/1986. This image recording material is a photosensitive pressure-sensitive thermal-developing type image recording material which contains silver halogenide, a reducing agent, polymerizing compound and color image forming material. At least the polymerizing compound and the color image forming material are, in combination, sealed in microcapsules.

An image recording apparatus capable of using the above-described photosensitive pressure-sensitive thermal developing type image recording material has been disclosed in Japanese Unexamined Patent Publication No. 209,461/1987. In the apparatus, first the image recording material is optically exposed to form a latent image thereon, and is then subjected to thermal developing so that, in the region of the image, the polymerizing compound is polymerized to produce macromolecular compound, thereby to harden the microcapsules. Thereafter, the image receiving material is stacked on the image recording material thus treated, and the image receiving material and the image recording material are pressurized so that, in the region where no latent image is formed, some of the microcapsules are broken to transfer the color image forming material to the image receiving material to form a visible image.

The foregoing and other objects of the invention have also been achieved by the provision of an image recording apparatus in which a photosensitive material is employed which is formed by coating a support with a material which, when pressurized, fixes an image formed by optical exposure, and a visible image is obtained by pressurization, which, according to the invention, comprises a pair of pressurizing rollers for pressurizing the photosensitive material, and a back-up roller for applying a predetermined pressure to the back of one of the pair of pressurizing rollers, the back-up roller having a cylindrical middle portion and circular-truncated-cone-shaped right and left end portions which extend from both ends of the cylindrical middle portion and are smaller in diameter towards the outer ends thereof.

Examples of photosensitive materials which can be used in the image recording apparatus of this embodiment of the present invention are as follows:

In the first example, as described above and as disclosed by commonly assigned Japanese Unexamined Published Patent Application No. 179836/1982, the photosensitive material is optically exposed so that the polymerizing compound is hardened according to an image to be recorded, and it is then pressurized to render the image visible. The photosensitive material is formed by providing a layer of synthetic macromolecular resin wall capsules on a support which contains a vinyl compound, a photopolymerization initiator and a coloring precursor.

In the second example of the photosensitive material, a latent image formed thereon by optical exposure is subjected to wet developing or thermal developing, and then the photosensitive material is pressurized so that the image is made visible. Examples of such a photosensitive material are disclosed in Japanese Unexamined Published Patent Application No. 53881/1986, also commonly assigned. In the photosensitive material disclosed in the former application, after thermal developing, the color image forming material is transferred to an image receiving material having an image receiving layer so that the desired image is obtained. The photosensitive material is formed by coating a support at least with photosensitive silver halogenide, a reducing agent, a polymerizing compound and a color image forming material.

Among these materials, at least the polymerizing compound and the color image forming material are, in combination, sealed in microcapsules. In the photosensitive material disclosed in the latter application, an image is recorded without using the image receiving material; that is, it is formed on the photosensitive material itself. In other words, the image receiving layer is formed on the photosensitive material. More specifically, a photosensitive layer is formed on a support, which layer contains silver halogenide, a reducing agent, a polymerizing compound and two types of materials which color when contacted. The polymerizing compound and one of the two types of materials are, in combination, sealed in microcapsules, and the other of the two types of materials is provided outside the microcapsules.

Another object of the invention is to provide an image recording method using a photosensitive material which is formed by coating a support with a material which, when pressurized, fixes an image formed by optical exposure and in which the photosensitive material is conveyed smoothly without being deformed so that an image is recorded with high picture quality.

The foregoing and other objects of the invention have been achieved by the provision of an image recording method in which the photosensitive material is pressurized and conveyed by a pair of pressurized rollers in a direction perpendicular to the longitudinal direction of the pressurizing rollers in such a manner that, while the photosensitive material passes through the pressurizing rollers, a pressure which increases gradually along the axis of the pressurizing rollers from both ends towards the middle thereof is applied to the photosensitive material.

A further object of the invention is to provide an image forming method using a photosensitive material which is formed by coating a support with a material, which, when pressurized, fixes an image formed by optical exposure, in which an image is recorded with high picture quality, and a pair of pressurizing rollers for pressurizing the photosensitive material can be manufactured at a low cost.

The foregoing and other objects of the invention have been achieved by the provision of an image recording method in which a photosensitive material formed by coating a support with a material which, when pressurized, fixes an image formed by optical exposure is employed and a visible image is obtained through pressurization, in which the photosensitive material is pressurized and conveyed by a pair of pressurizing rollers in a direction perpendicular to the longitudinal direction of the pressurizing rollers in such a manner that, while passing through the pressurizing rollers, the photosensitive material is pressed by a pressure whose distribution in the longitudinal direction of the pressurizing rollers varies by no more than 30%.

Still another object of the invention is t provide an image recording apparatus with a pressure-operated image transferring device of simple construction which provides a uniform pressure in the nipping region of a pair of pressurizing nip rollers arranged parallel to one another, thereby to positively transfer the image on the image receiving material.

The foregoing and other objects of the invention have been achieved by the provision of an image recording apparatus employing a photosensitive material formed by coating a support with a material which, when pressurized, fixes an image formed thereon through optical exposure and the image thus fixed is transferred from the photosensitive material to an image receiving material, which, according to the invention, comprises a pressure-operated image transferring device including a fixed nip roller rotatably supported which has a width ($L_1$) ranging from 210 mm to 350 mm and a diameter ($D_1$) ranging from 30 mm to 50 mm; a free nip roller arranged parallel to the fixed nip roller, the free nip roller having a width ($L_2$) equal to or larger than the width ($L_1$) of the fixed nip roller an d a diameter ($D_2$) in a range of $D_1/1.6$ to $D_1/1.3$; and a back-up roller pushing the free nip roller against the fixed nip roller, the back-up roller having an effective back-up width ($L_3$) defined by the following equation:

$$L_3 = L_1/3 \pm 10 \text{ mm}$$

In the pressure-operated image transferring device of the invention, one of the two parallel nip rollers is rotatably supported at both ends, while the other is movably pushed against the fixed nip roller by means of the back-up roller. That is, the three rollers cooperate to make the pressure in the nipping region of the two nip rollers uniform over the length. Furthermore, the pressure in the nip region can be adjusted merely by changing the pressurizing force of the back-up roller.

The manner in which the foregoing and other objects are achieved by this invention will become more apparent from the following detailed description and the appended claims when read in conjunction with the accompanying drawings.

DESCRIPTION OF THE PREFERRED EMBODIMENTS

Preferred embodiments of the invention will be described with reference to the accompanying drawings.

Figure 1:
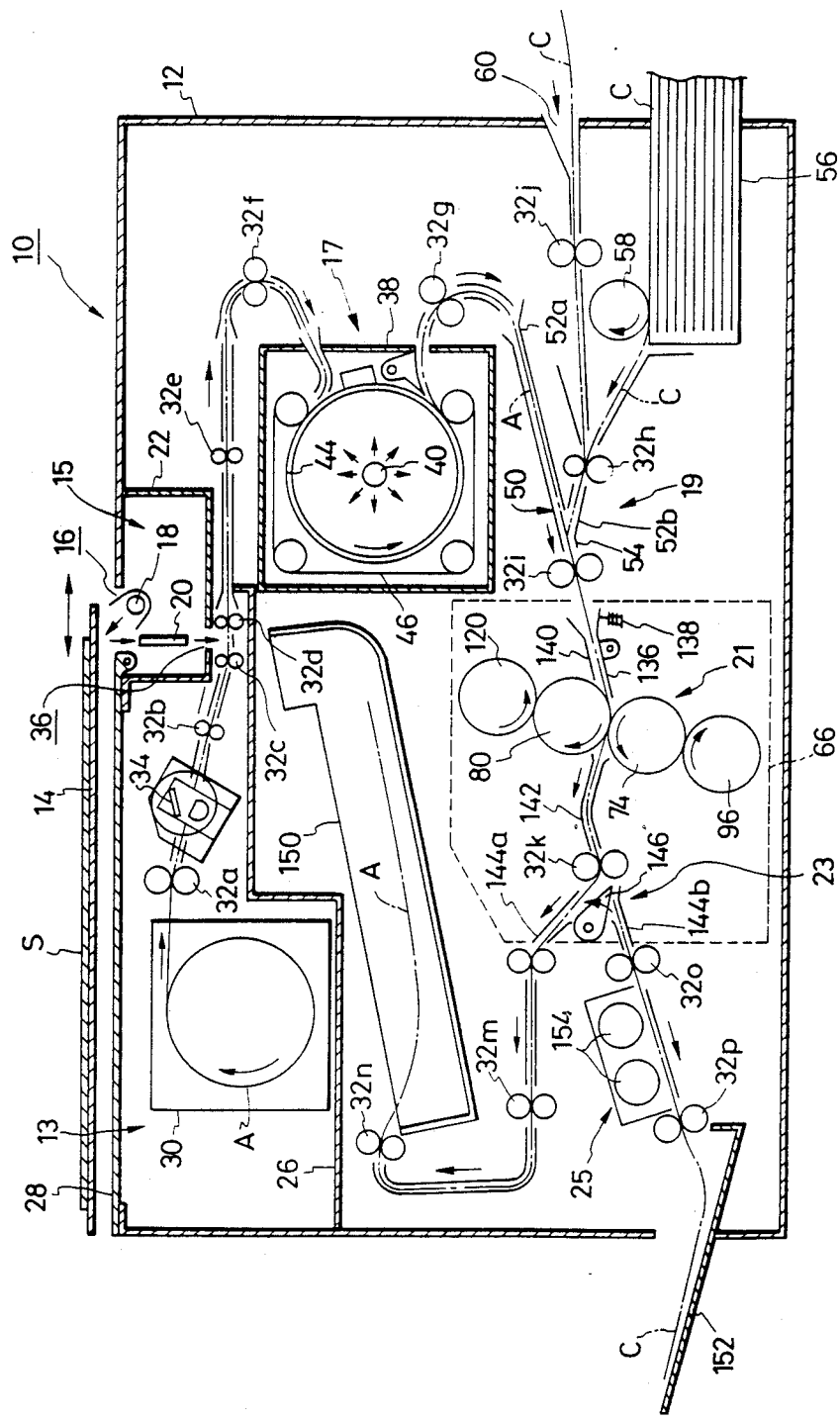
FIG. 1/ is an explanatory diagram showing the arrangement of an example of an image recording apparatus according to the invention.

As shown in FIG. 1, an image recording apparatus 10 according to the invention includes a housing 12 which accommodates a photosensitive material supplying section 13 having a photosensitive pressure-sensitive thermal-developing type recording material (hereinafter referred to merely as "a photosensitive material" when applicable); an image reading section 15 for reading image data provided on an original S, a thermal image developing section 17 for heating a photosensitive material A, a sheet stacking section 19 for stacking an image receiving sheet C on the photosensitive material A, a pressure-operated image transferring section 21 for applying pressure to the photosensitive material A and the image receiving sheet C, a sheet separating section 23 for separating the image receiving sheet C from the photosensitive material A, and an image fixing section 25 for fixing the image on the image receiving sheet C.

A transparent supporting glass plate 14 is provided on the top surface of the housing 12 to support an original S. The glass plate 14 is reciprocated, as indicated by a double-headed arrow in FIG. 1, over an opening 16 by a drive device (not shown) mounted on the upper surface of the image reading section 15. The image reading section 15 includes a light source for irradiating the original S through the opening 16, and a focusing optical system 20. The light source 18 and the focusing optical system 20 are surrounded by a wall 22.

The photosensitive material supplying section 13 is optically shielded by a partition wall 26 provided in the upper portion of the housing 12. A magazine 30 including a roll of photosensitive material A is loaded into the photosensitive material supplying section 13 through a lid member 28 coupled to the top surface of the housing 12 in such a manner that the lid member 28 can be freely opened and closed. The photosensitive material A is formed by coating a support with photosensitive silver halogenide, a reducing agent, a polymerizing compound and a color image forming material. Of these materials, at least the polymerizing compound and the color image forming material are sealed, in combination, in microcapsules.

The photosensitive material supplying section 13 has first through fourth roller pairs 32a through 32d for conveying the photosensitive material A from the magazine to the image reading section 15. A cutter 34 is disposed between the first and second roller pairs 32a and 32b to cut the photosensitive material A to a predetermined length. An exposing opening 36 formed in the bottom surface of the partition wall surrounding the image reading section 15 is positioned between the third and fourth roller pairs 32c and 32d.

The thermal image developing section 17, which is surrounded with a heat insulating partition wall 38, is disposed below the image reading section 15. The photosensitive material A passed through the image reading section is conveyed into the thermal image developing section 17 through fifth and six roller pairs 32e and 32f. The section 17 includes a hollow-cylinder-shaped heating drum 44 accommodating a halogen lamp 40, and an endless belt 46 which contacts a part of the outer cylindrical wall of the heating drum 44 in such a manner that the photosensitive material A is conveyed while being held between the belt and the drum and heated.

The photosensitive material A passed through the section 17 is delivered through a seventh roller pair 32g to the sheet stacking section 19. The section 19 has a Y-shaped guide board 50. The board 50 has a first incoming (receiving) path 52a near the seventh roller pair 32g, a second incoming path 52b near an eighth roller pair 32h, and an outgoing (outlet) path 52c at which the first and second incoming paths meet and which is close to a ninth roller pair 32i.

A cassette 56 holding a number of image receiving sheets C is loaded in the lower portion of the housing at one corner. In the apparatus of FIG. 1, a sheet feeding roller 58 is installed above the cassette 56 to supply the image receiving sheet C through the eighth roller pair 32h into the second incoming path 52b of the Y-shaped guide board 50. A manual sheet supplying inlet 60 is formed in the housing 12 above the cassette 56 so that the image receiving sheet C can be manually inserted into the inlet 60 and delivered to the second incoming path 52b through a tenth roller pair 32j.

Figure 2:
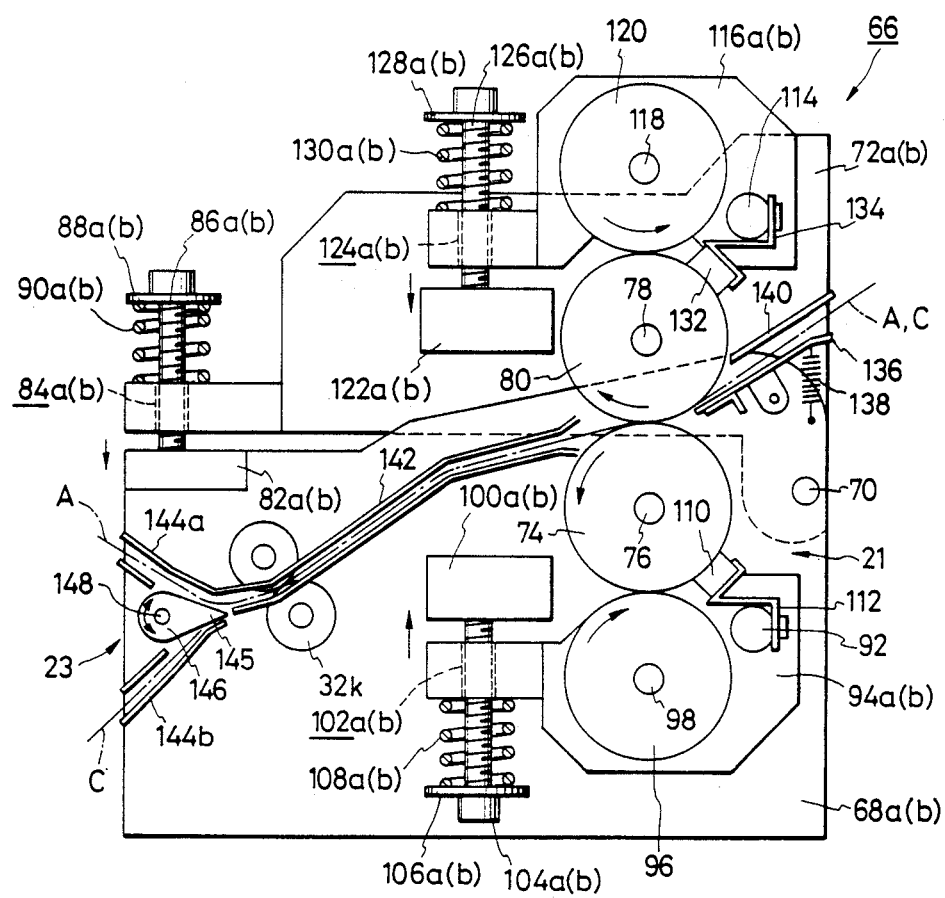
FIG. 2 is an explanatory diagram showing a pressurizing unit in the image recording apparatus according to the invention.
Figure 3:
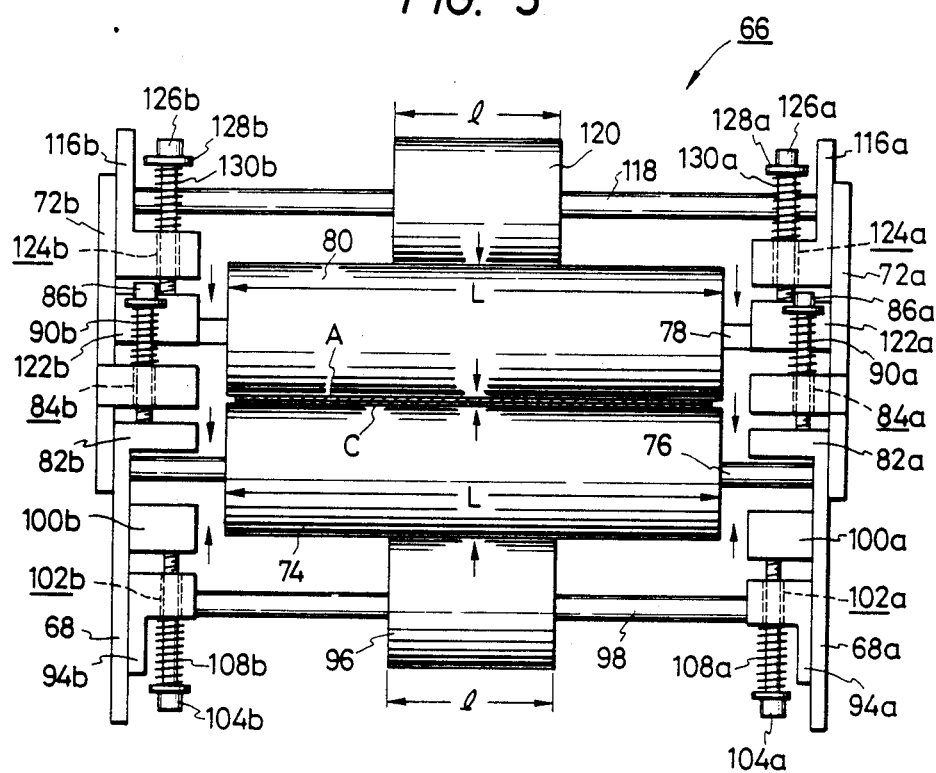
FIG. 3 is a front view showing the arrangement of a first example of a pressure-operated image transferring section in the image recording apparatus of a first embodiment of the invention.

A pressurizing unit 66, including the pressure-operated image transferring section 21 and the sheet separating section 23, is provided behind the ninth roller pair 32i. The pressurizing unit 66, as shown in FIGS. 2 and 3, includes first supporting boards 68a and 68b secured to the housing 12, and second supporting boards 72a and 72b which are rotatably supported, at first ends, through shafts 70 by the boards 68a and 68b, respectively. A first pressurizing roller 74, which is rotated by a drive source (not shown), is mounted on a shaft 76 which extends between the first supporting boards 68a and 68b. A second pressurizing roller 80 is rotatably supported through a shaft 78 by the second supporting boards 72a and 72b. These pressurizing rollers 74 and 80 can be manufactured by hardening a roller made of SK or SCM material by high frequency hardening, and plating the cylindrical wall with hard chromium. Preferably, the hardening depth is at least 5 mm from the outer cylindrical wall of the roller, and the hardness is at least HRC 60.

Holders 82a and 82b are formed at the end portions of the first supporting boards 68a and 68b which confront second ends of the second supporting boards 72a and 72b, respectively. Bolts 86a and 86b are secured to the holders 82a and 82b through holes 84a and 84b formed in the second end portions of the second supporting boards 72a and 72b, respectively. In this case, springs 90a and 90b are interposed between the flanges of the bolts 86a and 86b and the second end portions of the second supporting boards 72a and 72b, respectively, so that the second end portion of the second supporting boards 72a and 72b are urged towards the holders 82a and 82b of the first supporting boards 68a and 68b, respectively. That is, the second pressurizing roller 80 is pushed against the first roller 74 by the elastic force of the springs 90a and 90b.

First holding boards 94a and 94b are rotatably supported, at first ends, through shafts 92 by the first supporting boards 68a and 68b, respectively. A first back-up roller 96 is rotatably supported through a shaft 98 by the first holding boards 94a and 94b. The length l of the back-up roller 96 is determined from the following expression:

$$l = 1/3L \pm 20 (mm) \quad (1)$$

where L is the length of the first pressurizing roller 74.

Bolts 104a and 104b are inserted into holes 102a and 102b formed in second end portions of the first holding boards 94a and 94b, and are secured to holders 100a and 100b formed on the first supporting boards 68a and 68b, respectively. Springs 108a and 108b are interposed between the flanges 106a and 106b of the bolts 104a and 104b and the second end portions of the first holding boards 94a and 94b, respectively, so that the second end portions of the first holding boards 94a and 94b are urged towards the holders 100a and 100b of the first supporting boards 68a and 68b, respectively. As a result, the first back-up roller 96 is pushed against the back of the first pressurizing roller 74 at its middle portion. A cleaning shoe 110 is mounted on mounting boards 112 which are secured to the shafts 92 of the first holding boards 94a and 94b in such a manner that the shoe is in sliding contact with the first pressurizing roller 74.

Similarly, second holding boards 116a and 116b are rotatably supported, at first end portions, through shafts 114 by the second supporting boards 72a and 72b, respectively. A second back-up roller 120 is rotatably supported through a shaft 118 by the second holding boards 116a and 116b. Similar to the first back-up roller 96, the length of the second back-up roller 120 is determined so as to satisfy equation (1) above where, in this case, L is the length of the second pressurizing roller 80. The back-up rollers 96 and 120 are preferably made of the same material as the pressurizing rollers 74 and 80.

Bolts 126a and 126b are inserted into holes 124a and 124b formed in second end portions of the second holding boards 116a and 116b and are then secured to holders 122a and 122b formed on the second supporting boards 72a and 72b, respectively. Springs 130a and 130b are interposed between the flanges 128a and 128b of the bolts 126a and 126b and the second end portions of the second holding boards 116a and 116b so that the second end portions of the second holding boards 116a and 116b are urged towards the holders 122a and 122b by the elastic forces of the springs, and the second back-up roller 120 is pressed against the second pressurizing roller 80 at its middle portion. A second cleaning shoe 132 is coupled to mounting boards 134 which are mounted on the supporting shafts 114 of the second holding boards 116a and 116b in such a manner that the shoe is in sliding contact with the second pressurizing roller 80.

A blade 136 is disposed between the ninth roller pair 32i and the second pressurizing roller 80 and mounted in such a manner that it is rotatable with respect to the first supporting boards 68a and 68b. The blade 136 is provided with a spring 138. The spring 138 pulls the blade 136 at one end so that the other end of the blade 136 is brought into sliding contact with the second pressurizing roller 80. A guide board 140 is provided for the blade 136 and mounted in such a manner as to confront the latter.

An eleventh roller pair 32k is supported by the first supporting boards 68a and 68b. Guide boards 142 are provided between the eleventh roller pair 32k and the first and second pressurizing rollers 74 and 84. The guide boards form Y-shaped first and second outgoing paths 144a and 144b downstream of the eleventh roller pair 32k. A sheet separating pawl 146 with a sharp end 145 extending towards the eleventh roller pair 32k is mounted between the first and second outgoing paths 144a and 144b in such a manner that it is rotatably supported between the first supporting boards 68a and 68b.

The first outgoing path 144a is coupled through twelfth through fourteenth roller pairs 32l through 32n to a disposal tray 150 positioned below the photosensitive material supplying section 13. The photosensitive materials A are delivered into the disposal tray 150. On the other hand, the second outgoing path 144b is connected through fifteenth and sixteenth roller pairs 32o and 32p to a take-out tray 152 The image receiving sheets C are delivered into the tray 15. The fixing section 25 employing ultraviolet lamps 154 is arranged between the fifteenth and sixteenth roller pairs 32o and 32p.

The image recording apparatus of the invention is arranged fundamentally as described above. The operation of the image recording apparatus thus arranged will be described.

An original S bearing image data is placed on the original supporting glass plate 14, and then it together with the glass plate 14 is conveyed by a conveying device (not shown) as indicated by the arrow, i.e., it is auxiliarily scanned. In this operation, in the image reading section 15 the light source 18 is turned on to emit a light beam which is applied through the opening 16 and the glass plate 14 to the original S. On the other hand, a photosensitive material A is pulled out of the magazine 30 loaded in the photosensitive material supplying section 13 and is conveyed by means of the first through fourth rollers pairs 32a through 32d in such a manner that it is moved along the exposing opening 36 of the image reading section 15 at the same speed as the glass plate 14.

The light beam reflected from the image data of the original S is applied through the opening 36 to the photosensitive material A in the main scanning direction by means of the focusing optical system 20. As described above, the photosensitive material A includes a photosensitive pressure-sensitive thermal developing type recording material layer. The latent image of the original is formed on the photosensitive material A by the reflected light beam. The photosensitive material A pulled out of the magazine 30 is cut to a predetermined length by the cutter 34.

The photosensitive material A thus exposed is delivered to the thermal image developing section 17 through the fifth and sixth roller pairs 32e and 32f. In the section 17, the photosensitive material A is conveyed while being held between the heating drum 44 and the endless belt 46. During this conveyance, the photosensitive material A is subjected to thermal developing by the halogen lamp 42. As a result, the polymerizing compound in the region covered by the latent image is polymerized and the microcapsules in that region are hardened.

Then, the photosensitive material A is delivered through the seventh roller pair 32g and via the first incoming path 52a of the Y-shaped guide board 50 to the sheet piling section 19. The cassette 56 accommodating a number of image receiving sheets C is loaded in the image recording apparatus 10. The image receiving sheets are delivered, one at a time, through the eighth roller pair 32h and the second incoming path 52b of the Y-shaped guide board 50 to the sheet stacking section 19 by means of the sheet feeding roller 58. As a result, in the sheet stacking section 19, the sheet C is brought into contact with the lower surface of the photosensitive material A. In this connection, it should be noted that the sheet stacking state is adjusted so that, when the image receiving sheet C is stacked on the photosensitive material A, the front edge of the photosensitive material A is closer to the ninth roller pair 32i than the image receiving sheet C. The image receiving sheet C may be supplied through the manual sheet supplying inlet 60 opening in one side of the housing 12 and through the tenth roller pair 32j to the sheet stacking section 19 by the operator.

The photosensitive material A and the image receiving sheet C stacked together is delivered through the outgoing path 54 in the sheet stacking section 19 t the pressure-operated image transferring section 21 by means of the ninth roller pair 32i. In the section 21, as shown in FIGS. 2 and 3, the first and second pressurizing rollers 74 and 80 are pressed against each other by the elastic forces of the springs 90a and 90b, and the photosensitive material A and the image receiving sheet C are introduced into the nip region of the pressurizing rollers 74 and 80. Since the front edge of the blade 136 is abutted against the outer cylindrical wall of the second pressurizing roller 80 by the spring 138, the photosensitive material A and the image receiving sheet C, which have been stacked together, are suitably introduced into the nip region of the first and second pressurizing rollers 74 and 80.

When the photosensitive material A and the image receiving sheet C are pressed by the rollers 74 and 80, the microcapsules in the region of the photosensitive material A where no latent image is formed are broken, and hence the color image forming material is transferred to the image receiving sheet C; that is, a visible image is formed on the sheet C.

As described above, the first and second pressurizing rollers 74 and 80 are pressed against each other, at both ends, through the shafts 76 and 78 by the elastic forces of the springs 90a and 90b, while the first and second back-up rollers 96 and 120 are pressed against the first and second pressurizing rollers 74 and 80, at the middle, through the shafts 98 and 118 by means of the springs 108a and 108b and 130a and 130b, respectively. The length l of the first and second back-up rollers 96 and 120 is set to one-third the length L of the first and second pressurizing rollers 74 and 80, as shown in FIG. 3, so that the photosensitive material A and the image receiving sheet C are pressed suitably against each other.

Figure 4:
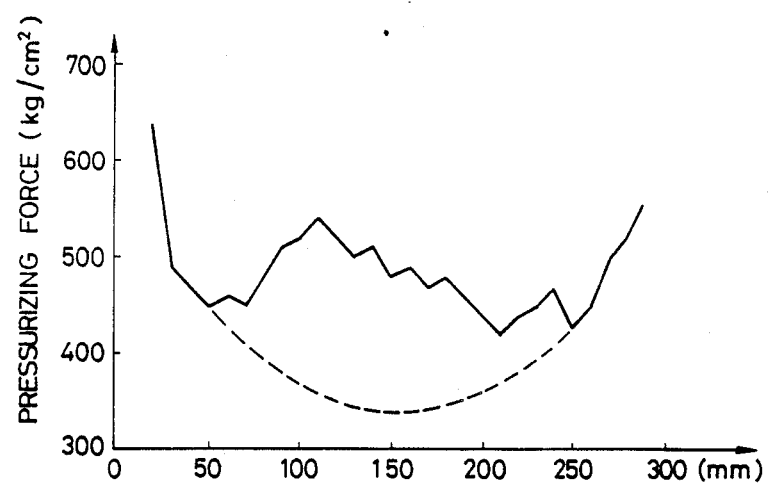
FIG. 4 is a characteristic diagram indicating a pressurizing force distribution in the image recording apparatus of FIG. 3.

In an actual example in which the length L of the first and second pressurizing rollers 74 and 80 was set to 330 mm while the length l of the first and second back-up rollers 96 and 120 was set to 110 mm, the pressurizing force distribution was as indicated by the solid line in FIG. 4. Therefore, as is apparent by comparison with the broken line in FIG. 4 which shows the case where the first and second back-up rollers 96 and 120 were not employed, the nonuniform pressurizing force distribution due to the bend of the first and second pressurizing rollers 74 and 80 was suitably corrected. Accordingly, the image data formed, as the latent image, on the photosensitive material A is uniformly transferred to the image receiving sheet C with high accuracy. It is not always necessary for the ratio of the length L of the first and second pressurizing rollers 74 and 80 to the length of the first and second back-up rollers 96 and 120 to be exactly 3:1. That is, it has been confirmed through experiments that the length may, in the example under discussion, vary within ±20 mm.

Figure 5:
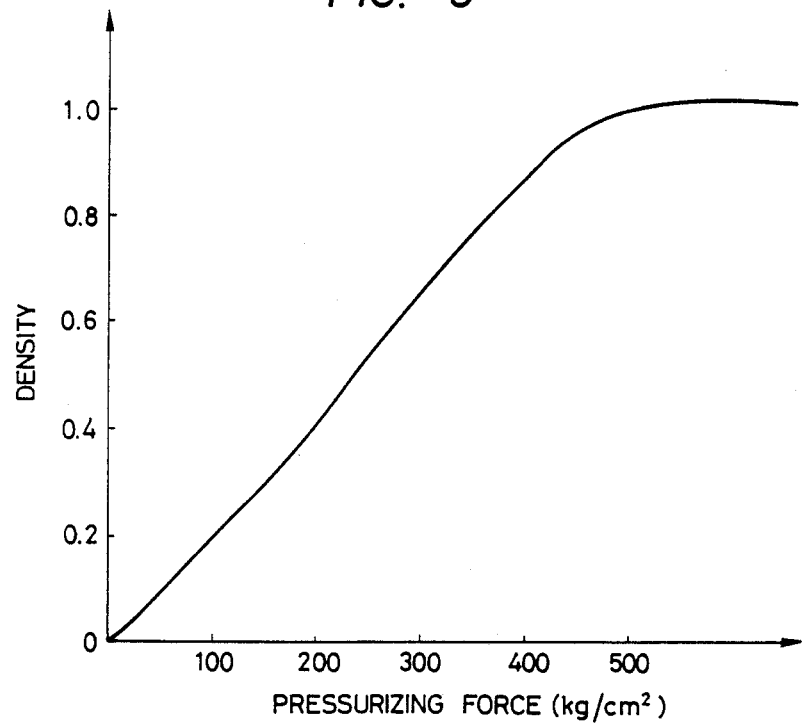
FIG. 5 is a characteristic diagram indicating pressurizing force with image density in the image recording apparatus of FIG. 3.

In addition, it is known that the relation between the pressurizing force applied to the photosensitive material A and the image receiving sheet C and the density of the image transferred onto the image receiving sheet C is as shown in FIG. 5. That is, FIG. 5 shows that the density of the image transferred to the image receiving sheet C increases substantially in proportion to the pressurizing force applied to the photosensitive material and the image receiving sheet. However, after the pressurizing force reaches a certain value, the density is maintained substantially unchanged. Therefore, if the springs 90a, 90b, 108a, 108b, 130a and 130b are adjusted according to the above-described relation, then the most suitable pressurizing force can be applied to the photosensitive material A and the image receiving sheet. That is, if the elastic forces of these springs are adjusted so that the pressurizing force of the first and second pressurizing rollers 74 and 80 is uniform in the longitudinal direction, then not only can the best image, free from unevenness, be obtained, but also image unevenness due to nonuniformities in the material of the photosensitive material A and the image receiving sheet C is eliminated, and in addition the photosensitive material A and the image receiving sheet C can be conveyed straightly, without deviation from the designated conveyance path, at all times.

The photosensitive material A and the image receiving sheet C which have been pressurized at the pressure-operated image transferring section 21, is delivered through the guide board 142 to the sheet separating section 23 by means of the eleventh roller pair 32k. In the sheet separating section 23, the sheet separating pawl 146 is turned about the shaft 148 in the direction of the arrow to separate the photosensitive material A from the image receiving sheet C. As described above, in the sheet stacking section 19, the photosensitive material A is stacked on the image receiving sheet C in such a manner that the front edge of the photosensitive material A is ahead of that of the image receiving sheet C. Therefore, the photosensitive material A is delivered to the first outgoing path 144a with the sharp end 145 of the sheet separating pawl 146, while the image receiving sheet C separated from the photosensitive material A is delivered to the second outgoing path 144b.

The image receiving sheet C delivered to the second outgoing path 144b is passed to the fixing section 25 by means of the fifteenth roller pair 32o, where the image transferred to the image receiving sheet C is fixed by means of the ultraviolet lamps 154. The sheet C thus processed is delivered to the take-out tray 152 by means of the sixteenth roller pair 32p. On the other hand, the photosensitive material A in the first outgoing path 144a is delivered to the disposal tray 150 by means of the twelfth, thirteenth and fourteenth roller pairs 32l, 32m and 32n.

Figure 6:
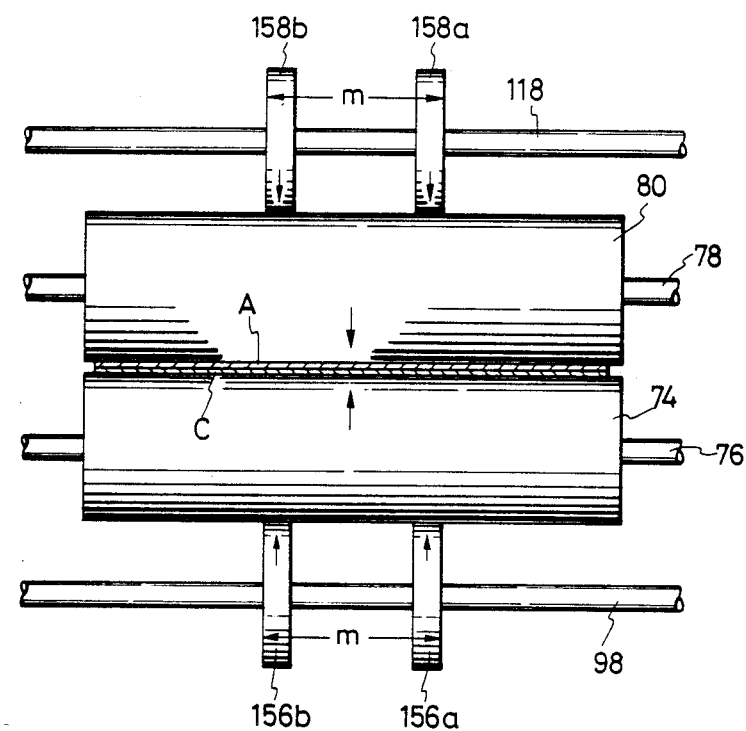
FIG. 6 is a front view, with parts removed, showing a second embodiment of a pressure-operated image transferring section in the image recording apparatus of the invention.

In a second embodiment, the first and second backup rollers 96 and 120 pressed against the first and second pressurizing rollers 74 and 80 at their middle portion are replaced by a pair of rollers 156a and 156b and a pair of rollers 158a and 158b, respectively, as shown in FIG. 6. That is, when the distance m between the pair of rollers 156a and 156b, which is equal to that between the pair of rollers 158a and 158b, is made equal to the length l of the first and second back-up rollers 96 and 120, the resultant pressurizing force distribution is similar to that shown in FIG. 4. In this case, the total weight of the rollers 156a, 156b, 158a and 158b is smaller than that of the rollers 96 and 120, and therefore the image recording apparatus can be reduced in weight.

As described above, the image recording apparatus of the invention is designed so that, after a latent image corresponding to the image data of an original is formed on the photosensitive pressure-sensitive image recording material, the image receiving sheet is pressed against the image recording material with the pressurizing rollers which are pressed at their middle portions by the back-up rollers, respectively, whose length is about one-third the length of the pressurizing rollers, so that the image is accurately transferred to the image receiving sheet. In this operation, the pressurizing rollers press the image recording material and the image receiving sheet uniformly with the aid of the back-up rollers so that the image transferred to the image receiving sheet is considerably high in picture quality. Since the pressurizing rollers are pressed by back-up rollers having the most appropriate configuration, a reduction in the weight of the image recording apparatus can be readily achieved. This is another merit of the invention.

Figure 7:
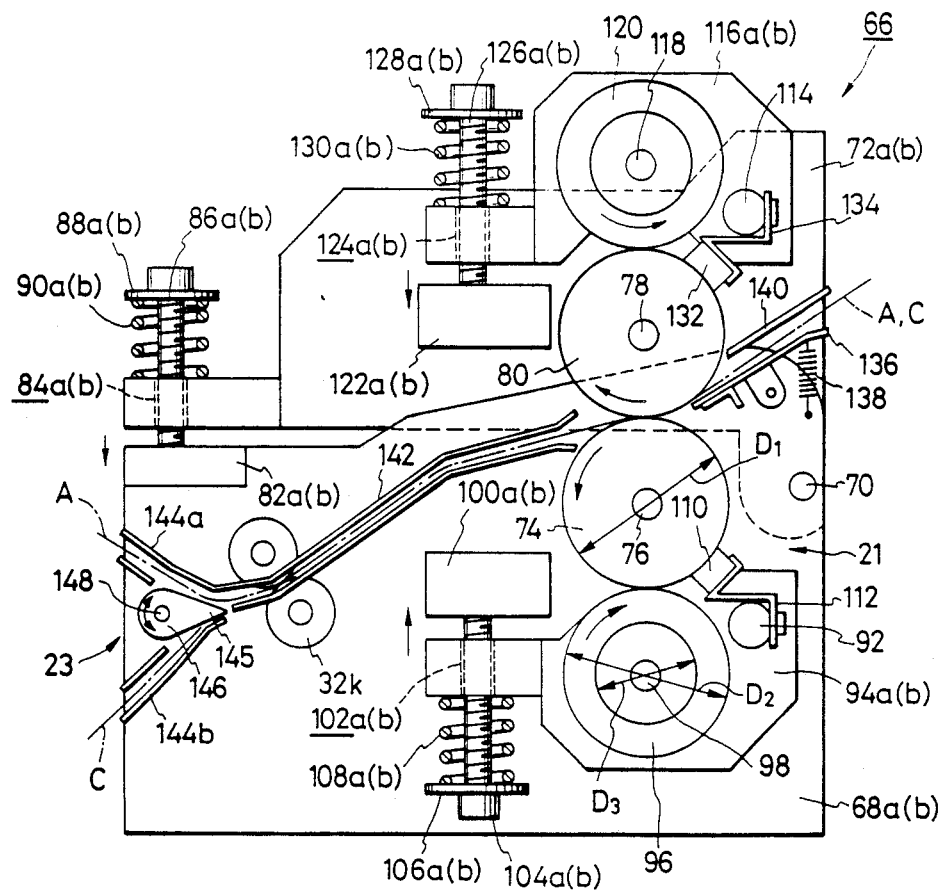
FIG. 7 is an explanatory diagram showing the arrangement of a pressurizing unit in the apparatus according to a third embodiment of the invention.
Figure 8:
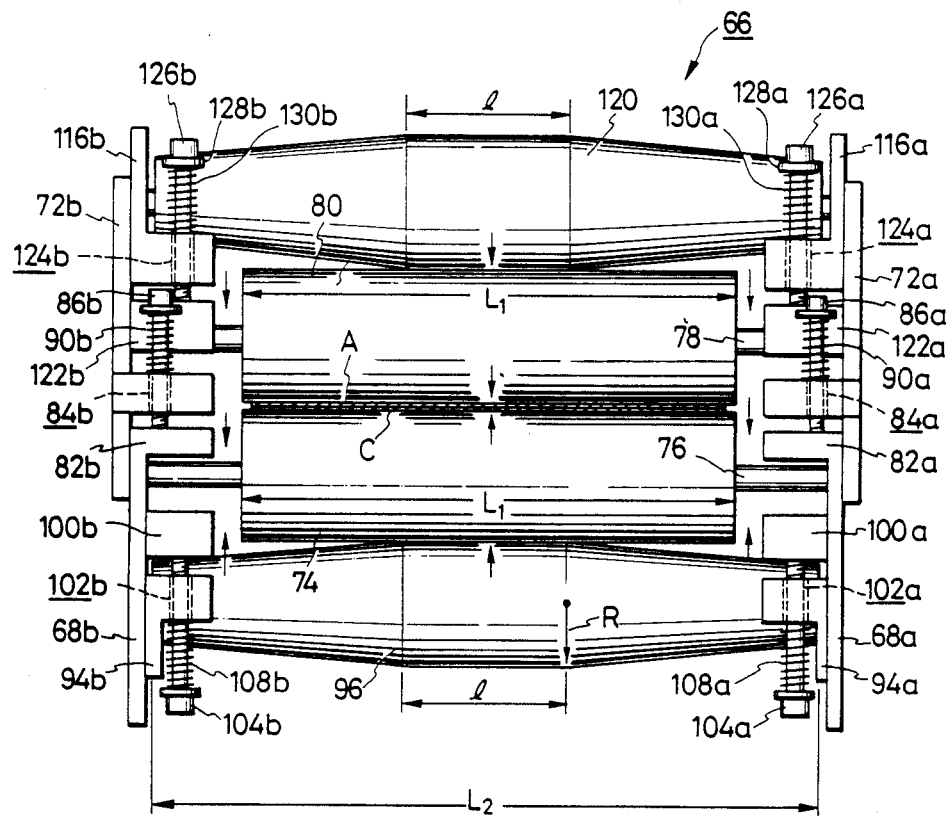
FIG. 8 is a front view showing the arrangement of a pressure-operated image transferring section in the apparatus of FIG. 7.

A third embodiment of the invention will be described with reference to FIGS. 7 and 8.

In this embodiment, the first back-up roller 96 has a substantially cylindrical middle portion having a length of constant diameter, and right and left circular-truncated-cone-shaped portions which are tapered towards the ends. The periphery of each of the junctions between the cylindrical middle portion and the right and left circular-truncated-cone-shaped portions is rounded with a radius of curvature of 50 mm or more.

The first and second pressurizing rollers 74 and 80 are pressed against each other at both ends through the shafts 76 and 78 by the elastic forces of the springs 90a and 90b, while the first and second back-up rollers 96 and 120 are pressed against the first and second pressurizing rollers 74 and 80, at their middle portions, through the shafts 98 and 118 by means of the springs 108a and 108b and 130a and 130b, respectively. As a result, the first and second back-up rollers 96 and 120 are slightly curved upwardly and downwardly by the elastic forces of the springs 108a and 108b and 130a and 130b, respectively. However, adjusting the elastic forces to suitable values can bring the side walls of the cylindrical middle portions and the side walls of the circular-truncated-cone-shaped right and left portions of the first and second back-up rollers, that is, the side walls of the first and second back-up rollers 96 and 120, into contact with the backs of the pressurizing rollers 74 and 80, respectively. Thus, the photosensitive material A and the image receiving sheet C are suitably pressed against each other.

In this connection, it has been confirmed through experiments that, if the length of contact between the pressurizing roller and the back-up roller is at least 10 mm, the pressurizing rollers are prevented from being deformed, and the image data recorded on the photosensitive material A is uniformly and accurately transferred to the image receiving sheet C.

It will be evident to those skilled in the art that various changes and modifications may be made also to this embodiment without departing from the invention. For instance, the back-up rollers may take the form of crown rolls which are larger in diameter towards the middle than the two ends.

Figure 9:
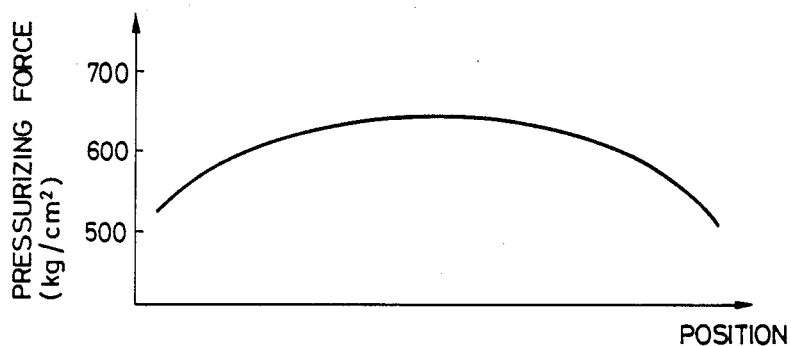
FIG. 9 is a characteristic diagram showing the pressure distribution of a pair of pressurizing rollers in accordance with a fourth embodiment of the invention.

In a fourth embodiment of the invention, the pressure applied to the photosensitive material A and the image receiving sheet C is adjusted by controlling the elastic forces of the springs 90a, 90b, 108a, 108b, 130a and 130b so that, as shown in FIG. 9, it increases gradually from both ends of the pressurizing rollers 74 and 80 towards the middle. Accordingly, the photosensitive material A and the image receiving sheet C are pressed against each other forming no crease, and the image data is accurately transferred onto the image receiving sheet.

That is, when the photosensitive material A and the image receiving sheet C is held between the pressurizing rollers 74 and 80, both end portions thereof tend to displace towards the two ends of the pressurizing rollers 74 and 80 because the pressurizing force is smaller at the two ends of the pressurizing rollers 74 and 80. Therefore, even if the photosensitive material A and/or the image receiving sheet C has creases, the creases are smoothed out, as a result of which the photosensitive material A and the image receiving sheet C are conveyed while being maintained in a highly flat state. Thus, the image data recorded on the photosensitive material A is uniformly transferred to the image receiving sheet C; that is, the resultant image on the sheet C is high in picture quality.

In addition, as mentioned above, it is known that the relation between the pressurizing force applied to the photosensitive material A and the image receiving sheet C and the density of the image transferred to the image receiving sheet C by the pressurizing force is as shown in FIG. 5. That is, FIG. 5 shows that the density of the image transferred to the image receiving sheet C increases substantially in proportion to the pressurizing force applied to the photosensitive material and the image receiving sheet. However, after the pressurizing force reaches a certain value (about 500 kg/cm$^2$), the density is maintained substantially unchanged. Therefore, if the springs 90a, 90b, 108a, 108b, 130a and 130b are adjusted according to the above-described relation, then the most suitable pressurizing force can be applied to the photosensitive material A and the image receiving sheet C. For instance, if the elastic forces of the springs are adjusted so that, as shown in FIG. 9, a pressure of about 500 kg/cm$^2$ is applied to both ends of the pressurizing rollers 74 and 80, then the resultant image is best in quality with a minimum pressure, and the difficulty can be eliminated of the resultant image not being uniform in density because of the nonuniformity in material of the photosensitive material A and the image receiving sheet C. The pressurizing rollers 74 and 80 are used merely to provide a pressure which is at least 500 kg/cm$^2$ and increases gradually from both ends thereof towards the middle. Therefore, it is unnecessary for the pressurizing rollers 74 and 80 to have a considerably high manufacturing accuracy, and accordingly the rollers can be easily manufactured.

Figure 10:
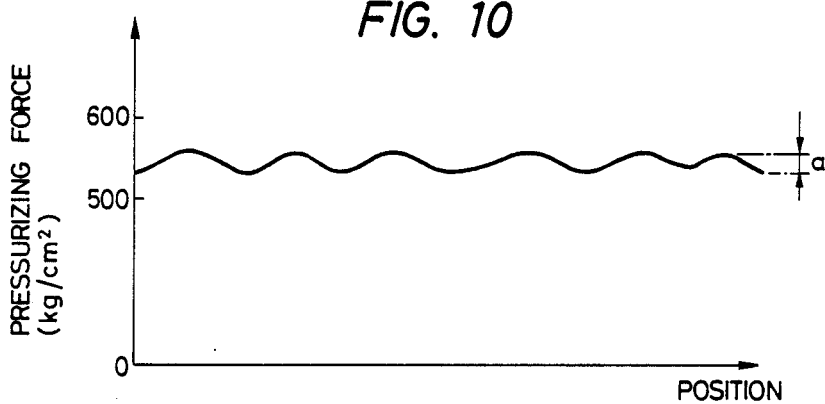
FIG. 10 is a characteristic diagram showing the distribution of pressure of a pair of pressurizing rollers in the apparatus in FIG. 1 in accordance with a fifth embodiment of the invention.

In accordance with a fifth embodiment of the invention, it has been found that, when the deviation a of the pressure distribution of the pressurizing rollers 74 and 80 in the axial direction thereof is set within a predetermined range as shown in FIG. 10, then the resultant image is higher in picture quality. More specifically, it has been found that when the deviation a is held within 30%, the photosensitive material A and the image receiving sheet C are effectively prevented from being creased, and when the deviation is within 20%, the formation of creases is completely prevented, and accordingly the resultant image is substantially or completely free from nonuniformities in density due to the formation of creases. Accordingly, a very high picture quality is obtained. If, as described above, the deviation a of the pressure distribution is held within 30%, it is unnecessary to manufacture the pressurizing rollers 74 and 80 with an extremely high accuracy; that is, these rollers can be inexpensively manufactured.

If the elastic forces of the springs 90a, 90b, 108a, 108b, 130a and 130b are adjusted so that the pressurizing force of the first and second pressurizing rollers 74 and 80 is uniform in the longitudinal direction within the deviation a thereof, then not only can an image free from unevenness be obtained, but also image unevenness due to nonuniformities in the material of the photosensitive material A and the image receiving sheet C can be eliminated, and in addition the photosensitive material A and the image receiving sheet C can be conveyed straightly, i.e., without meander, at all times.

As described above, in the image recording method of the fifth embodiment in which the photosensitive material is pressurized and conveyed by the pressurizing rollers in such a manner that, while the photosensitive material passes through the pressurizing rollers, the pressure distribution of the pressurizing rollers in the longitudinal direction is held within 30% in deviation from a constant value, the photosensitive material will not be creased when pressurized by the pressurizing rollers, and therefore the resultant image is high in quality. Furthermore, since the pressure distribution of the pressurizing rollers is held within a deviation of 30%, the pressurizing rollers can be inexpensively manufactured.

As was described above with respect to FIGS. 7 and 8, the first and second pressurizing rollers 74 and 80 are pressed against each other at both ends through the shafts 76 and 78 by the elastic forces of the springs 90a and 90b, and are pushed by the elastic forces of the springs 108a and 108b and the springs 130a and 130b through the shafts 98 and 118 and the first and second back-up rollers 96 and 120, respectively. Therefore, the first back-up roller 96 is slightly upwardly curved by the elastic forces of the spring 108a and 108b, while the second backup roller 120 is also slightly downwardly curved by the elastic forces of the springs 130a and 130b. However, in this case, if the elastic forces of the springs are suitably adjusted, then the first and second back-up rollers 96 and 120 can be pushed against the first and second pressurizing rollers 74 and 80 in such a manner that the side of the cylindrical middle portion and the sides of the right left tapered portions of each of the back-up rollers, that is, the entire sides of the back-up rollers are brought into contact with the respective pressurizing rollers, whereby the photosensitive material A and the image receiving sheet C are pressurized most suitably.

It has been found through experiments that, when the contact length between the pressurizing roller and the back-up roller is set to at least 10 mm, the first and second pressurizing rollers 74 and 80 are free from inward buckling so that the image data recorded on the photosensitive material A is uniformly and accurately transferred to the image receiving sheet C.

In accordance with the sixth embodiment, the dimensions of the first and second pressurizing rollers 74 and 80 and the first and second back-up rollers 96 and 120, and the spring constants of the springs 90a, 90b, 108a, 108b, 130a and 130b are as indicated in the following Table 1. In this case, the maximum width of the photosensitive material A and the image receiving sheet C which can pass through the first and second pressurizing roller while being pressed is about 300 mm. Reference characters $L_1$, $L_2$, $D_1$, $D_2$ and $D_3$ in Table 1 are defined as indicated in FIGS. 7 and 8.

TABLE 1

| Item | Pressurizing rollers 74 & 80 | Back-up rollers 96 & 120 |
|---|---|---|
| Length | $L_1$ = 330 mm | $L_2$ = 350 mm Cylindrical middle portion's length l = 110 mm |
| Diameter | $D_1$ = 40 mm | $D_2$ = 40 mm $D_3$ = 36 mm |
| Spring constant | Springs 90a and 90b 15 kg/mm | Springs 108a, 108b, 130a and 130b 24.2 kg/mm |
| Spring length | 55.5 mm | 25 mm |

Figure 11:
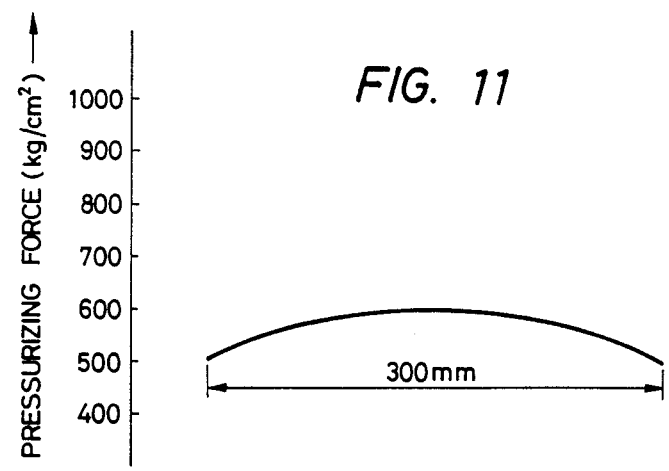
FIG. 11 is a graphical representation indicating the distribution of pressure applied to the sheets in the pressure-operated image transferring section shown in FIG. 8 in accordance with a sixth embodiment of the invention.

When, according to the data indicated in Table 1 above, the bolts 86a, 86b, 104a, 104b, 126a and 126b were turned to suitably adjust the elastic forces of the springs 90a, 90b, 108a and 108b, 130a and 130b to press the photosensitive material A and the image receiving sheet C, which were 300 mm in width, with the first and second pressurizing rollers 74 and 80, the pressure applied to the sheets was distributed as shown in FIG. 11. That is, the pressure was about 500 kg/cm$^2$ at both ends, and about 600 kg/cm$^2$ at the middle. In this case, the sheets were not creased at all. Since a pressure of at least 500 kg/cm$^2$ was applied to the sheets over the entire length, the resultant image was uniform in density; that is, the image was satisfactorily transferred from the photosensitive material A to the image receiving sheet C.

Similarly, photosensitive materials and image receiving sheets which are 210 mm and 182 mm in width were tested. As a result, it has been found that they were not creased at all and the resultant images were high in picture quality. In these tests, the drive torque for the drive device (not shown) for driving the first and second pressurizing rollers 74 and 80 was 140 kg-cm.

Figure 12:
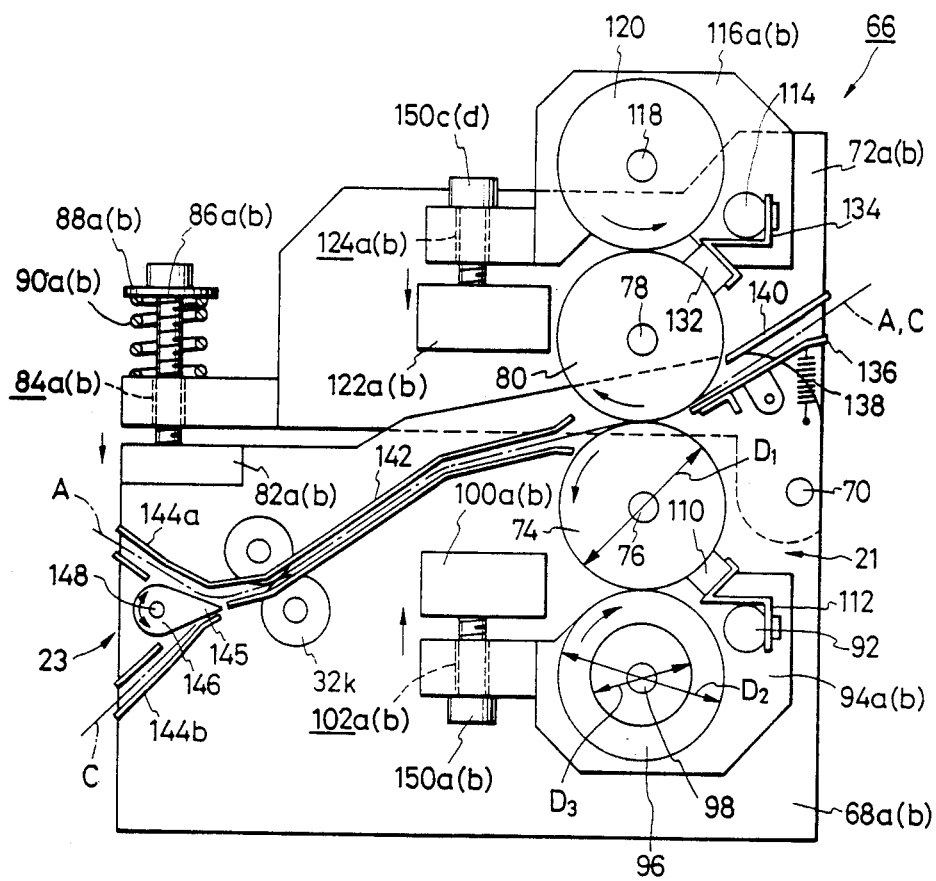
FIG. 12 is an explanatory diagram showing the arrangement of the pressurizing unit used in a seventh embodiment of an image recording apparatus of the invention.
Figure 13:
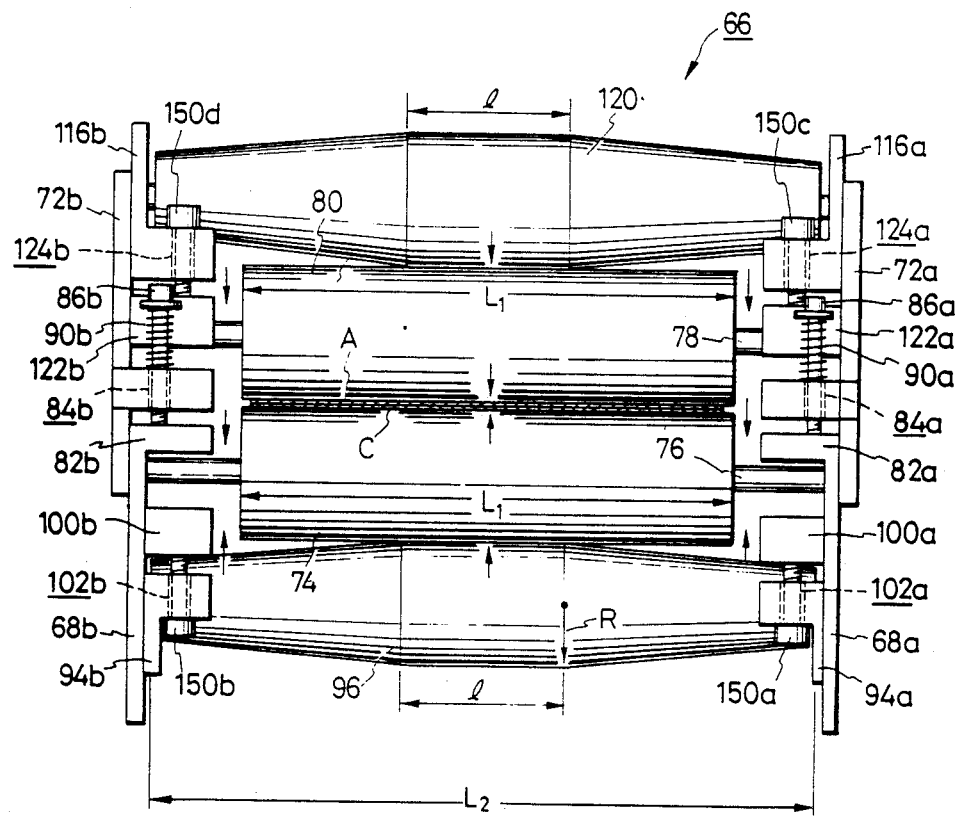
FIG. 13 is a front view showing the arrangement of a pressure-operated image transferring section in the pressurizing unit shown in FIG. 12.

In the above-described embodiment, the pressures of the back-up rollers are changed by adjusting the elastic forces of the springs; however, they may be changed by means of bolts as shown in FIGS. 12 and 13. That is, in the pressurizing unit 66 as shown in FIGS. 7 and 8, the springs 108a, 108b, 130a and 130b are removed, and instead bolts 150a through 150d are used as shown in FIGS. 12 and 13 so as to adjust the pressures of the backup rollers 96 and 120.

Figure 14:
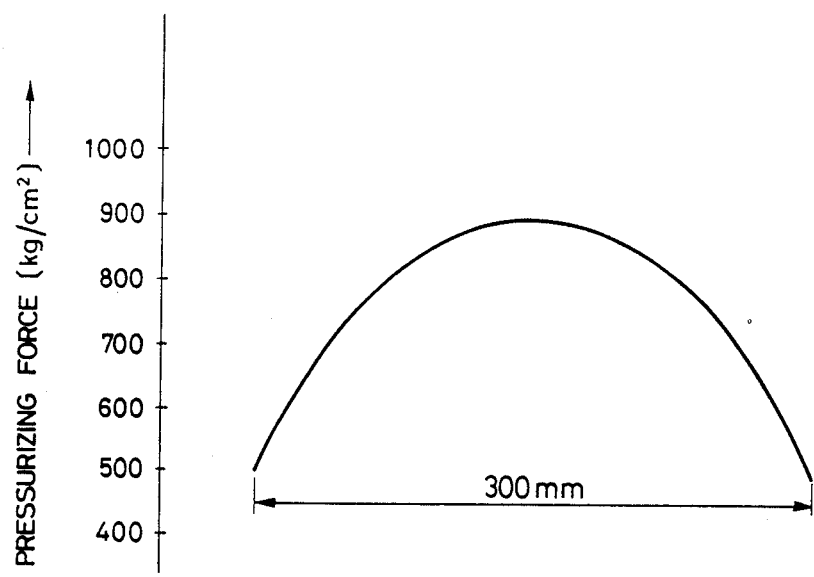
FIG. 14 is a graphical representation indicating the distribution of pressure applied to the sheets in the pressure-operated image transferring section shown in FIG. 13.

In samples of the photosensitive material A and the image receiving sheet C 300 mm rollers 74 and 80 in the pressurizing unit thus modified, the pressure applied to the sheets was distributed as shown in FIG. 14. That is, the pressure was 500 kg/cm$^2$ at both ends and 900 kg/cm$^2$ at the middle. Under this condition, the photosensitive materials A and the image receiving sheets C 300 mm and 210 mm in width were pressurized with the first and second pressurizing rollers 74 and 80. However, these sheets were not creased at all, and the resultant images were satisfactory in picture quality.

As is apparent from the above description, the pressure applied to the photosensitive material and the image receiving sheet in the case where the pressures of the back-up rollers are adjusted by means of the bolts (referred to as "bolt pressurization") is more variable than that applied to the photosensitive material and the image receiving sheet in the case where the pressures of the back-up rollers are adjusted by means of the springs (referred to as "spring pressurization"). This is because the rigidity in the case of bolt pressurization is higher than that in the case of spring pressurization. Also, the drive torque required for the drive source (not shown) to turn the first and second pressurizing rollers 74 and 80, being 200 kg-cm, is larger by 50% than in the case of spring pressurization. However, a pressurizing unit using bolt pressurization can be manufactured at a lower cost than one using spring pressurization. Generally, bolt pressurization is preferably employed for an image recording apparatus produced on a small scale and spring pressurization for an image recording apparatus produced on a large scale.

Figure 15:
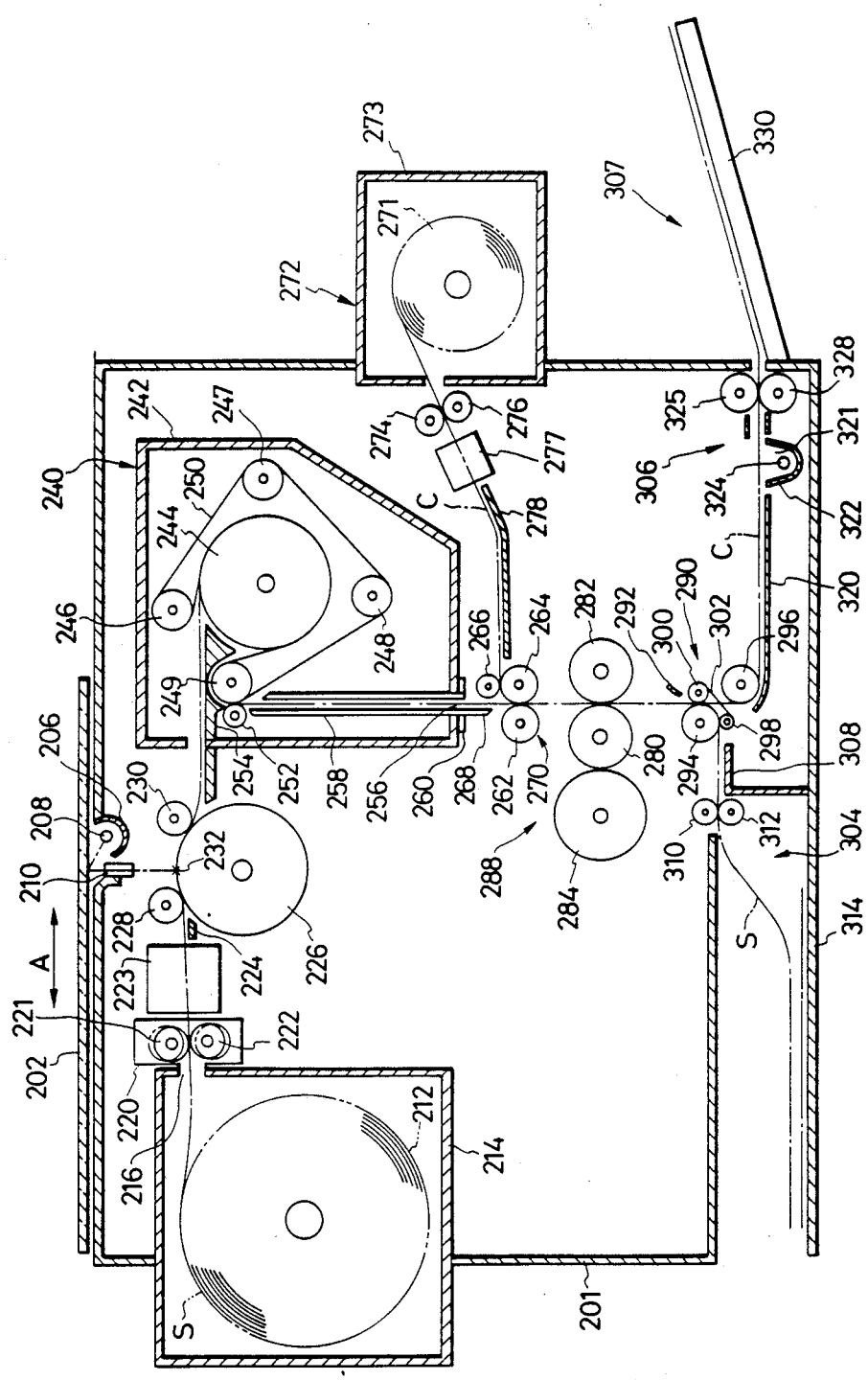
FIG. 15 is an explanatory diagram showing the arrangement of an example of an image recording apparatus according to an eighth embodiment of the invention.

An image recording apparatus according to an eighth embodiment of the invention, as shown in FIG. 15, has an original supporting glass plate 202 mounted on a housing 201 in such a manner that it can slidably reciprocate in directions indicated by the arrow A. That is, the glass plate 202 is reciprocated in the directions of the arrow A with the surface of the original to be copied directed downwardly.

An illuminating lamp 208 with a reflecting mirror 206 for illuminating the original is provided below the glass plate 202. In addition, a fiber lens array 210 for forming the image of the original on a photosensitive material S at a predetermined position is also provided below the glass plate 202.

A photosensitive material cartridge 214, which accommodates a roll of photosensitive material 212 formed by winding the photosensitive material S, is detachably mounted on one side of the housing 201. A pair of photosensitive material supplying (feeding) rollers 221 and 222 enclosed in a magazine-connected dark box 220 are provided at the photosensitive material supplying outlet 216 of the magazine 214, so that a predetermined length of the photosensitive material S of the roll 212 is supplied when required and the material retracted when necessary.

When the front end of the photosensitive material S approaches the photosensitive material supplying roller 221 and 222, the two rollers move away from each other (as indicated by phantom lines in the drawing) so as to facilitate the movement of the photosensitive material S. A cutter unit 223 for cutting the photosensitive material S and a guide board 224 are provided forwardly of the dark box 220. ("Forwardly of" as used herein is intended to mean "downstream of" of the photosensitive material in the direction of movement.)

An exposed photosensitive material supporting roller 226 and two photosensitive material nip rollers 228 and 230 abutted against the supporting roller 226 are arranged downstream of the guide board 224. The photosensitive material S is guided by the guide board 224 and brought into close contact with the roller 226 by action of the nip rollers 228 and 230 so that the latent image is formed on the photosensitive material S at the position 232 between the nip rollers 228 and 230 by means of the fiber lens array 210.

An image developing device 240 for developing the latent image on the photosensitive material S by heating is provided in front of the exposed photosensitive material supporting roller 226. The image developing device 240 includes a developing housing 242 of the heat insulation type, a heating roller 244 heated to about 120° C., an endless belt 250 supported by four belt supporting rollers 246, 247, 248 and 249 and wound through an angle of about 270° C. around the heating roller 244, and a nip roller 252 held abutted against the supporting roller 249. The components 244, 246, 247, 248, 249, 250 and 252 are mounted in the developing housing 242.

The developing device 240 is further composed of guide 254 for guiding the photosensitive material S delivered from the exposed photosensitive material supporting roller 226 to the heating roller 244 and separating the developed photosensitive material S from the heating roller 244, a vertical guide 258 for guiding to an outlet 256 the developed photosensitive material S which is delivered by means of the belt supporting roller 249 and the nip roller 252, and a sensor 260 for detecting the front end of the photosensitive material S at the outlet 256.

A sheet stacking device 270 for stacking the photosensitive material S and the image receiving sheet one on another is provided just below the outlet 256 of the image developing device 240. The device 270 includes a pair of rollers 262 and 264 abutted against each other, a nip roller 266 abutted against the roller 264, and a guide member 268 for guiding the photosensitive material S delivered thereto to the nip region of the rollers 262 and 264.

An image-receiving-sheet supplying device 272 is provided beside the sheet stacking device 270. More specifically, an image-receiving-sheet cartridge 273, including a roll of image receiving sheet 271 rotatably supported on a stand, is detachably mounted on the opposite side of the housing 201. Inside the housing 201, a pair of sheet feeding rollers 274 and 276, a cutter unit 277 and a guide board 278 are arranged beside the cartridge 273.

A pressure-operated image transfer device 288 is provided below the sheet stacking device 270. The device 288 is composed of a fixed nip roller 282, a free nip roller 280, and a back-up roller 284 whose axis is flush with those of the nip rollers 280 and 282. The back-up roller 284 is provided to make the pressure of the nip rollers 280 and 282 uniform in the axial direction. The nip rollers 280 and 282 are pressed against each other at a pressure of about 500 kg/cm$^2$.

A sheet separating device 290 for separating the image receiving sheet from the photosensitive material is provided below the image transfer device 288. The device 290 includes a guide member 92, a first conveying roller 94, a second conveying roller 96, and a sheet separating belt 302 laid over guide rollers 298 and 300 in such a manner that it presses only the photosensitive material S at both sides of the first conveying roller 294.

A photosensitive material disposing section 304 is provided on one side of the sheet separating device 290 and an image fixing device 306 on the other side. The photosensitive material disposing section 304 includes a guide member 308, a pair of conveying rollers 310 and 312, and a disposal box 314. In the photosensitive material disposing section 304, the photosensitive material delivered from the sheet separating device 290 and guided by the guide member 308 is passed into the disposal box 314 by means of the conveying rollers 310 and 312.

The image fixing device 306 is composed of a guide member 320 with an illumination opening 321, an ultraviolet lamp 324 with a reflecting member 322, and a pair of conveying rollers 326 and 328. In the image fixing device, ultraviolet rays are applied to the image receiving sheet C for about five seconds, the sheet C being delivered from the sheet separating device 290 and guided by the guide member 320.

An image-receiving-sheet take-out section 307 is provided downstream of the image fixing device 306. The section 307 includes a take-out tray 330 for receiving the image receiving sheet C. The tray 330 is connected to the housing 301 in such a manner that it protrudes from the housing 301.

Figure 16:
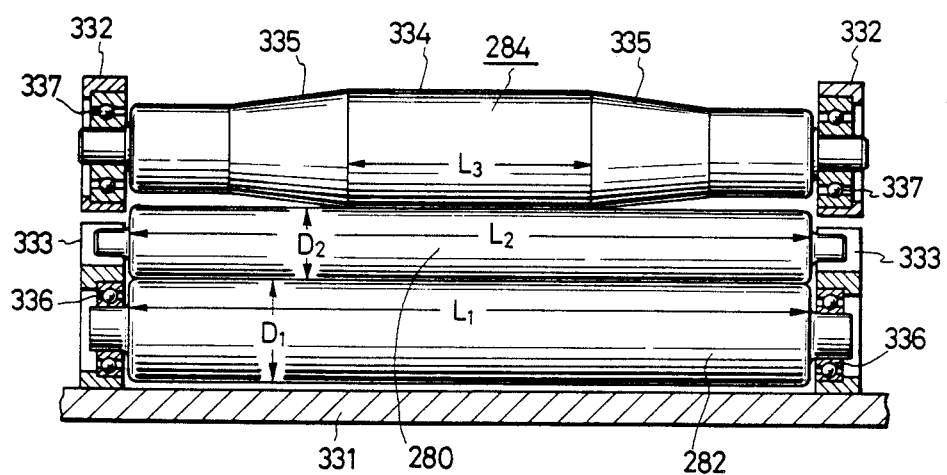
FIG. 16 is an explanatory diagram outlining a pressure-operated image transferring device in the image recording apparatus of FIG. 15.

The pressure-operated image transfer device of this embodiment of the invention will be described with reference to FIG. 16 in more detail.

The fixed nip roller 282 is rotatably supported, at both ends, by bearings 336 provided on a base 331 secured to the device body. The free nip roller 280 is arranged parallel to the fixed nip roller 282, and its diameter $D_2$ is smaller than the diameter $D_1$ of the fixed nip roller 282. The two end portions of the free nip roller 280 are supported by guide members 333 in such a manner that the free nip roller 280 is movable only in a direction perpendicular to the central axis of the fixed nip roller 282. The fixed nip roller 282 is rotated by a drive device (not shown) so as to convey the photosensitive material and the image receiving sheet while pressing them in cooperation with the free nip roller 280.

The back-up roller 284 is provided on one side of the free nip roller 280, on the other side of which the fixed nip roller 282 is disposed. The back-up roller 284 has an effective back-up portion 334 at the middle whose width $L_3$ (hereinafter referred to as "an effective back-up width $L_3$" when applicable) is smaller than the widths $L_1$ and $L_2$ of the nip rollers 282 and 280. The effective back-up portion 334 merges with tapered portions 335 at both ends. The back-up roller 284 is rotatably supported by bearings 337 at both ends, the bearings being secured to respective supporting members 332.

The diameter $D_2$ of the free nip roller 280 is smaller than that $D_1$ of the fixed nip roller 282 since the back-up pressure is applied only from the side of the free nip roller 280. Therefore, the diameter of the free nip roller 280 is made smaller than that of the fixed nip roller 282 so that the free nip roller 280 can be readily bent by the back-up roller 284 and the fixed nip roller 282 can be also readily bent.

The reason why the effective back-up width $L_3$ of the back-up roller 284 is smaller than the widths of the nip rollers 280 and 282 is that, in a back-up roller supported at both ends, the pressures at the two ends are higher than that at the middle. In order to compensate the pressure at the middle of the roller, the effective back-up width $L_3$ of the back-up roller 284 is made smaller.

The supporting members 332 are urged by means of spring members and bolts (not shown) provided on one side of the back-up roller 284, on the other side of which the free nip roller 280 is disposed, so as to press the back-up roller 284 at a predetermined pressure. As a result, the back-up roller 284 pushes the free nip roller 280, which in turn applies pressure to the fixed nip roller 282 so that the latter is pressed uniformly over its length.

Several experiments were performed on the pressure-operated image transfer device thus constructed. In these experiments, a plurality of free nip rollers differing in diameter were used to transfer the image from the photosensitive material to the image receiving sheet by pressurization, and the pressure distribution in the nip region was measured. The results of the experiments are as indicated in Table 2 and FIGS. 17A through FIG. 17G.

TABLE 2

| Experiment | Free nip roller diameter ($D_2$) | Result of transfer |
| --- | --- | --- |
| A | 10 mm | Not uniform |
| B | 15 mm | Not uniform |
| C | 20 mm | Satisfactory |
| D | 25 mm | Satisfactory |
| E | 30 mm | Satisfactory |
| F | 35 mm | Creased |
| G | 40 mm | Creased |

In all of the experiments described above, the width $L_1$ and diameter $D_1$ of the fixed nip roller were set to 250 mm and 40 mm, respectively, and the effective back-up width $L_3$ and diameter of the back-up roller were set to 80 mm and 50 mm, respectively.

Figure 17A:
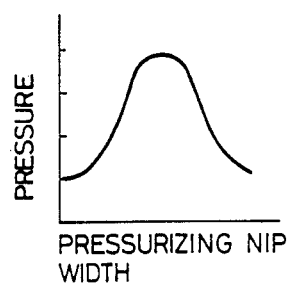
FIG. 17A through 17G are graphical representations indicating the results of experiments on the pressure-operated image transferring device of FIG. 15.
Figure 17B:
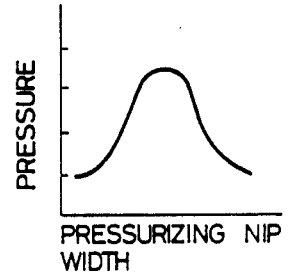
Figure 17C:
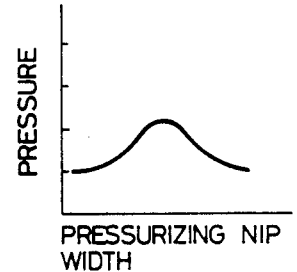
Figure 17D:
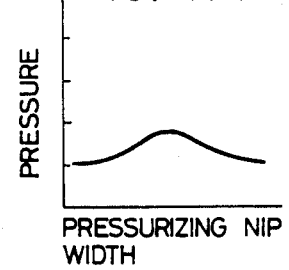
Figure 17E:
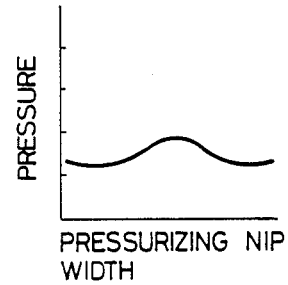

In experiments A and B, as is apparent from the pressure distributions shown in FIGS. 17A and 17B, respectively, the pressure at the middle of the nip region was excessively high, as a result of which the image was not uniformly transferred to the image receiving sheet.

Figure 17F:
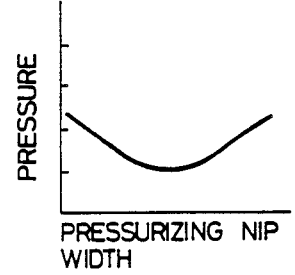
Figure 17G:
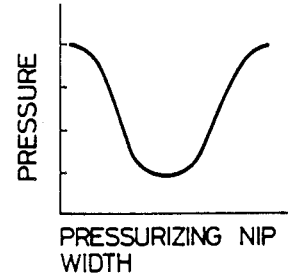

In experiments F and G, as is clear from FIGS. 17F and 17G, respectively, the pressures at both end portions of the nip region were excessively high, as a result of which the image receiving sheet was creased.

Through these experiments, the most suitable dimensions of the rollers 280, 282 and 284 have been confirmed as follows:

For the fixed nip roller, the width $L_1$ is 210 mm to 350 mm, and the diameter $D_1$ is 30 mm to 50 mm. For the free nip roller, the width $L_2$ is equal to or larger than the width $L_1$ ($L_2 \geq L_1$), and the diameter $D_2$ is in a range of $D_1/1.6$ $D_1/1.3$. For the back-up roller, the effective back-up width $L_3$ is $L_1/3 \pm 10$ mm, and the diameter is 30 mm to 50 mm or more. Especially, the most suitable diameter of the free nip roller is in a range of 23 mm to 25 mm.

In the above-described embodiment, the spring members and bolts are employed to adjust the pressurizing force of the back-up roller. However, the invention is not limited thereto or thereby; that is, they may be replaced by other suitable pressurizing force adjusting elements.

While the above embodiment of the invention has been described with reference to an image recording apparatus in which the photosensitive material which is heated for developing the latent image formed thereon is stacked on the image receiving material, and the photosensitive material and the image receiving material are pressurized so that the image is transferred to the image receiving material, the invention is not limited thereto or thereby. That is the technical concept of the invention is applicable also to an apparatus such as an electrophotographing device in which rollers are used to record images.

As is apparent from the above description, according to the invention, the pressure provided in the nip region of a pair of pressurizing nip rollers arranged parallel to one another can be made uniform over their length by a single back-up roller, which makes it possible to reduce the weight and size of the pressure-operated image transfer device in the image recording apparatus.

In the pressure-operated image transfer device of the invention, the force of the pressurizing nip roller can be controlled merely by adjusting the pressurizing force of the back-up roller. Therefore, the force adjusting mechanism is simple in construction. For the same reason, the pressure-operated image transfer device can handle a variety of photosensitive materials or image receiving materials differing in thickness or in width.

Accordingly, the pressure-operated image transfer device of the invention can provide images free from the difficulties that, because of the nonuniform pressurization, the image is not uniformly transferred to the image receiving sheet and the resultant colors are not uniform.

While preferred embodiments of the invention have been described, it is believed evident to those skilled in the art that various changes and modification may be made therein without departing from the invention.

What is claimed is:

1. In an image recording method employing a photosensitive material formed by coating a support with a material which, when pressurized, fixes an image formed by optical exposure so that a visible image is obtained through pressurization, the improvement comprising:

simultaneously pressurizing and conveying said photosensitive material with a pair of spring biased pressurizing rollers in a direction perpendicular to a longitudinal direction of said pressurizing rollers by adjustably controlling elastic forces of said pressurizing rollers by adjustably controlling elastic forces of a plurality of springs for biasing said pressurizing rollers in such a manner that, while said photosensitive material passes through said pressurizing rollers, a pressure which increases gradually along said pressurizing rollers from both ends towards the middle thereof is applied to said photosensitive material.

2. The method as claimed in claim 1, wherein a pressure of about 500 kg/cm$^2$ is applied to both ends of said pressurizing rollers.

3. An image recording method employing a photosensitive material formed by coating a support with a material which, when pressurized, fixes an image formed by optical exposure so that a visible image is obtained through pressurization, the improvement wherein:

said photosensitive material is pressurized and conveyed by a pair of spring biased pressurizing rollers in a direction perpendicular to the longitudinal direction of said pressurizing rollers by adjustably controlling elastic forces of a plurality of springs for biasing said pressurizing rollers in such a manner that, while passing through said pressurizing rollers, said photosensitive material is pressed by a pressure which increases gradually along said pressurizing rollers from both ends towards the middle thereof and whose distribution in the longitudinal direction of said pressurizing rollers deviates by no more than 30% from a fixed value.

4. The method as claimed in claim 3, wherein said distribution varies by no more than 20%.

* * * * *